United States Patent [19]

Koblitz et al.

[11] Patent Number: 5,237,222
[45] Date of Patent: Aug. 17, 1993

[54] COMPARATOR CIRCUIT FOR AN INTEGRATOR

[75] Inventors: Karl R. Koblitz; Kuno Lenz, both of Villingen, Fed. Rep. of Germany

[73] Assignee: Deutsche Thomson-Brandt GmbH, Fed. Rep. of Germany

[21] Appl. No.: 707,481

[22] Filed: May 30, 1991

[30] Foreign Application Priority Data

Jun. 1, 1990 [DE] Fed. Rep. of Germany ....... 4017738

[51] Int. Cl.[5] .................. G06G 7/12; G06G 7/18; H03L 5/00
[52] U.S. Cl. .................... 307/490; 307/264; 328/128
[58] Field of Search ............ 307/264, 491, 494, 296.1, 307/296.6, 228; 328/127, 128

[56] References Cited

U.S. PATENT DOCUMENTS

| | | | |
|---|---|---|---|
| 4,598,259 | 7/1986 | Gontowski, Jr. | 307/228 |
| 4,682,059 | 7/1987 | Garcia | 307/491 |
| 4,691,120 | 9/1987 | Kondo | 307/494 |
| 4,801,816 | 1/1989 | Merlo et al. | 307/228 |
| 4,855,626 | 8/1989 | Bohme | 307/491 |

Primary Examiner—Jin F. Ng
Assistant Examiner—Sinh Tran
Attorney, Agent, or Firm—Joseph S. Tripoli; Joseph J. Laks; Harvey D. Fried

[57] ABSTRACT

A comparator circuit for an integrator comprises first and second transistors triggered by the integrator. The integrator has a current-controlled input. The transistors generate respective comparator output control signals which change when the transistors switch between saturated and unsaturated states. The first and second transistors are complementary transistors. A first current source, comprising a third transistor, is coupled to a source of supply voltage. One of the first and second transistors forms a corresponding mirrored current source with respect to the first current source. The integrator comprises an integration capacitor coupled to the mirrored current source. An output stage is responsive to the output control signals from the first and second transistors.

19 Claims, 3 Drawing Sheets

5,237,222

COMPARATOR CIRCUIT FOR AN INTEGRATOR

BACKGROUND OF THE INVENTION

1. Field of the Invention

The invention concerns a comparator circuit for an integrator.

2. Prior Art

In many electrical circuits it is necessary to detect the level of signals and to alter the logic level of output signals depending on the momentary value of this level, for example, for ramp function generators using an integrator.

The comparator function can be implemented by using integrated comparators, for example, the LM 111 model from the manufacturer National Semiconductor. The integrator function can be implemented, for example, by using an operational amplifier of type 741 or a regenerative (feedback) transistor. A combination of both can be integrated on one chip.

However, for a defined operating manner of the comparator, its input voltage must normally lie in a range of approximately 1 to 2 volts above the ground potential and about 1 to 2 volts below the operating voltage. The range of input voltage which can be exploited is therefore clearly limited with respect to the operating voltage.

There are comparators, for example type LM 193 from the manufacturer National Semiconductor, with which the input voltage can be utilized up to the ground potential. However, the upper limit of the input voltage range for this type also lies approximately 1 to 2 volts below the operating voltage.

Apart from that, the circuits for such comparators are relatively expensive and an integrated comparator circuit for an integrator would require a relatively large chip area.

SUMMARY OF THE INVENTION

It is an object of the invention to provide a comparator circuit for an integrator which has an extended input voltage range and is less complex and expensive to implement.

This object is achieved by a comparator circuit according to the invention, wherein the saturation of complementary transistors triggered by the integrator is so utilized that comparator output control signals change only when the complementary transistors switch between saturated and unsaturated states. The corresponding saturation voltage VCEsat of each of the complementary transistors is about 50 mV. Two comparator outputs, for example, can be provided. The logic level of the first output is changed when the input voltage of the comparator circuit attains a first threshold value defined by the sum of the ground potential and VCEsat, and the logic level of the other output changes when the input voltage of the comparator circuit reaches a second threshold value defined by the difference between the operating voltage and VCEsat.

The output transistor for the first threshold value can be activated, for example, by an NPN transistor. The output transistor for the second threshold value can be activated, for example, by a PNP transistor.

DETAILED DESCRIPTION OF THE PREFERRED EMBODIMENTS

Figure 1:
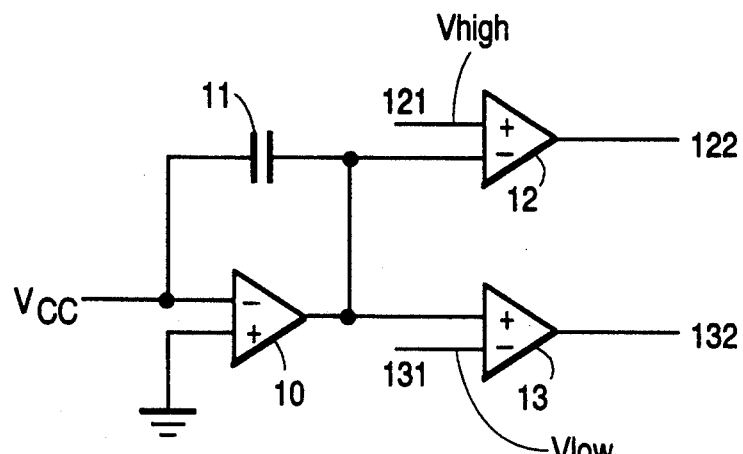
FIG. 1 shows a comparator circuit for an integrator according to the prior art.

An integrator according to the prior art consists of an amplifier 10 and an integration capacitor 11 as shown in FIG. 1. Two differential amplifiers 12 and 13 are connected to the output of this integrator. These are connected to an operating voltage Vcc and to ground potential. The reference voltage Vlow is applied to an input 131 of the first differential amplifier 13, and the reference voltage Vhigh is applied to an input 121 of the second differential amplifier 12. Vhigh at input 121 of the second differential amplifier 12 can then assume, for example, a maximum value defined by the difference Vcc−2 volts. Vlow at input 131 of the first differential amplifier 13 can assume, for example, a minimum value defined by the sum of ground potential+1 volt.

The maximum amount by which the comparator input voltage can be raised is therefore 2 to 3 volts lower than the operating voltage Vcc, and a corresponding integrated combination of integrator and comparators requires a relatively large chip surface.

Figure 2:
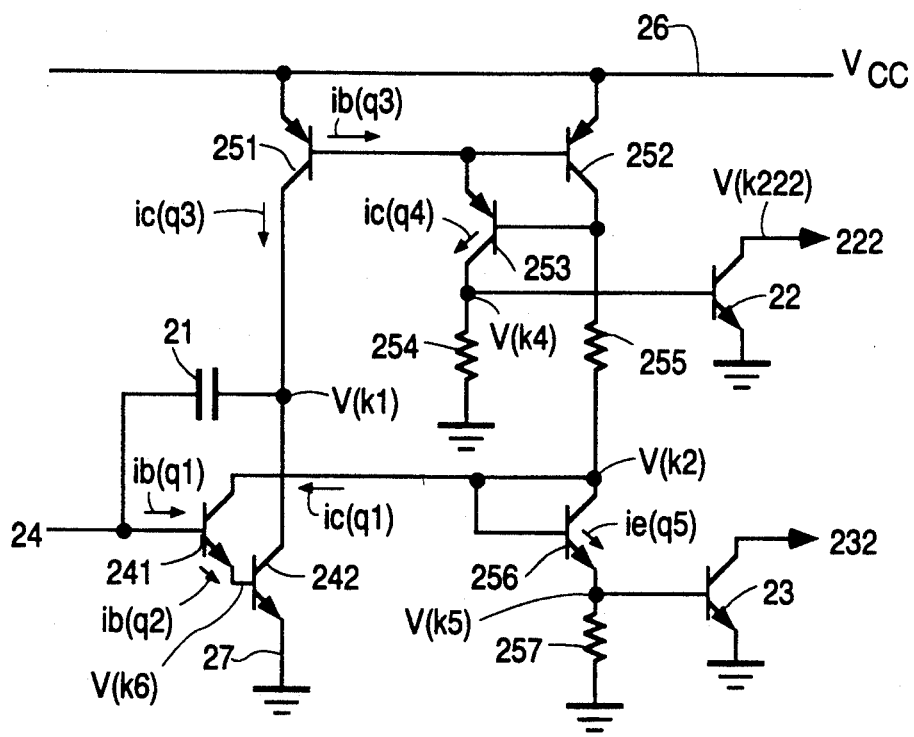
FIG. 2 shows a comparator circuit for an integrator according to the invention.

FIG. 2 illustrates an integrator according to the invention. The operating voltage Vcc is applied at terminal 26 and ground potential is applied at terminal 27. The integrator comprises transistors 241 and 242 and integration capacitor 21. The integrator is triggered with a current at input 24 and receives its supply current from a transistor 251 wired as a current reflector. This supplies a mirror image of the current from the current source using transistor 252.

The integration capacitor 21 is, likewise, connected to the reflected (mirrored) current source using transistor 251.

If a current flows into input 24, then the voltage at the vertex or node between transistors 251 and 242 and integration capacitor 21 decreases because this capacitor is discharged. The voltage at this node gradually approaches the value zero. This process ends when transistor 242 is saturated and has a saturation voltage between collector and emitter of approximately 50 mV. A base current thereby flows in transistor 242. This base current also flows through the collector of transistor 241 and through resistor 255, thus not flowing into resistor 256. The voltage at resistor 257 thereby drops and output stage transistor 23 is blocked. If current continues to flow into input 24, then transistor 241 also becomes saturated so that this current, advantageously, does not flow into the integration capacitor 21, but flows instead into the base of transistor 241. The lower level for the voltage at the node between transistors 251 and 242 and capacitor 21 is therefore detected by the blocking transistor 23. The current flowing through transistor 252 is, advantageously, only slightly influenced by the voltage fluctuation at the collector of transistor 241 if transistor 241 is saturated.

If a current flows out from input 24, then the voltage at the node between transistors 251 and 242 and integration capacitor 21 increases because this capacitor is charged. The voltage at this node gradually approaches the operating voltage 26 (Vcc). This process ends when transistor 251 is saturated and has a saturation voltage between collector and emitter of approximately 50 mV. A base current thereby flows in transistor 251. This base current is supplied through the collector of transistor 253, and further, through the resistor 254. The voltage at resistor 254 thereby increases and output stage transistor 22 becomes conductive. The upper level for the voltage at the node for transistors 251 and 242 and capacitor 21 is thus detected by the conducting transistor 22.

In this way, a voltage range defined by [Vcc−(2*VCEsat)] can be advantageously utilized for the comparator.

The lower expenditure on the circuitry for the comparator coupled with the integrator results in the required chip area upon integration being advantageously small and the supply current for this circuit being advantageously low.

If the comparator outputs 222 and 223 are, for example, utilized in order to respectively reverse the poles of a current source and this current source is only connected to input 24, then a ramp function generator results. The output voltage of this can be picked up at the node connecting integration capacitor 21 and transistors 242 and 251.

Figure 3A:
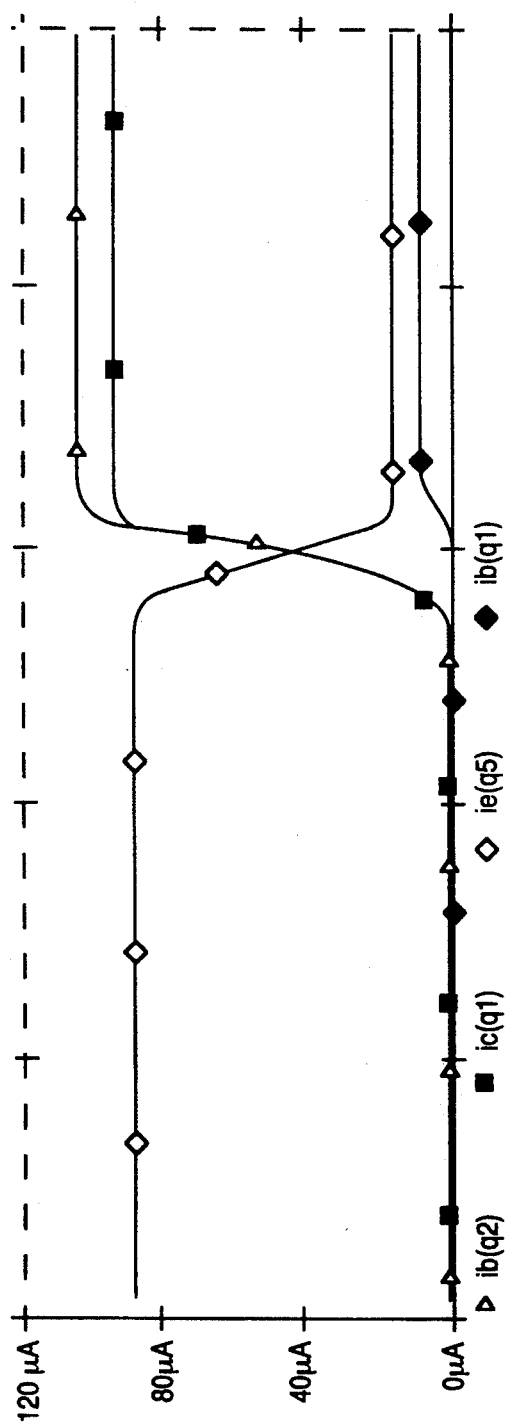
FIGS. 3(a) and 3(b) show current and voltage diagrams respectively for the comparator circuit of FIG. 2 when current is flowing into the input 24.
Figure 3B:
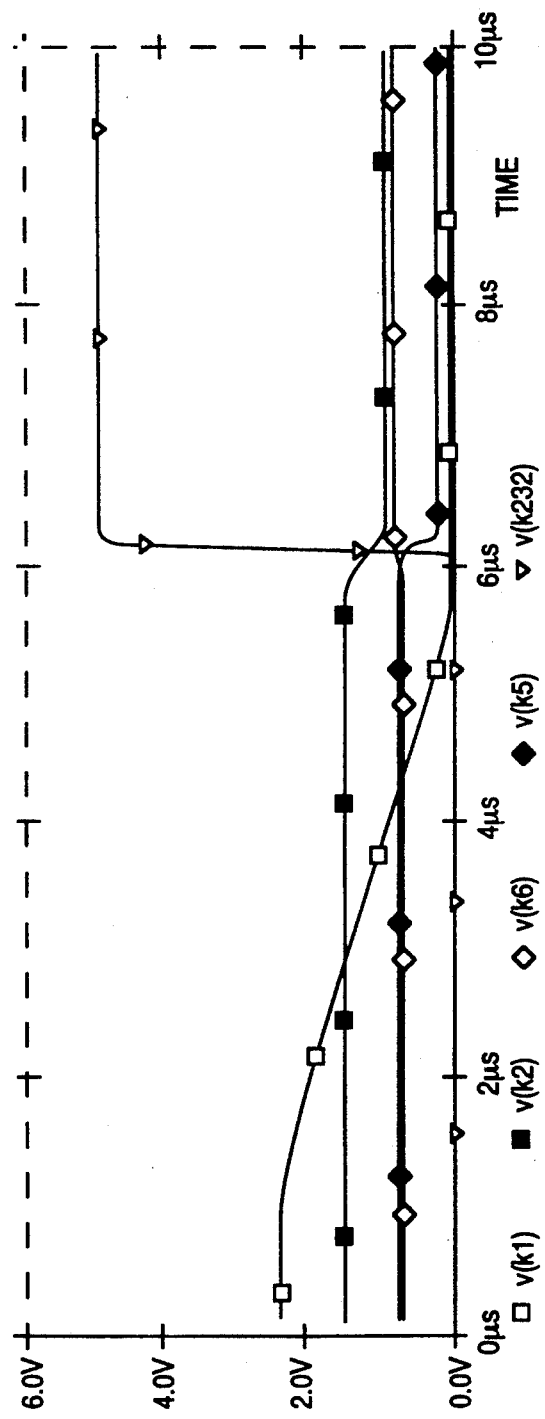

Some temporal current and voltage waveforms in the comparator circuit according to FIG. 2 for the case of a current flowing into input 24 are shown in FIGS. 3(a) and 3(b), wherein:

ib(q2) is the base current of transistor 242;
ic(q1) is the collector current of transistor 241;
ie(q5) is the emitter current of transistor 256;
ib(q1) is the base current of transistor 241;
v(k1) is the voltage at collector of transistor 242;
v(k2) is the voltage at collector of transistor 256;
v(k6) is the voltage at base of transistor 242;
v(k5) is the voltage at base of transistor 23; and,
v(k232) is the voltage at collector of transistor 23 if this is coupled with the operating voltage 26 (Vcc) via a resistor.

Figure 4A:
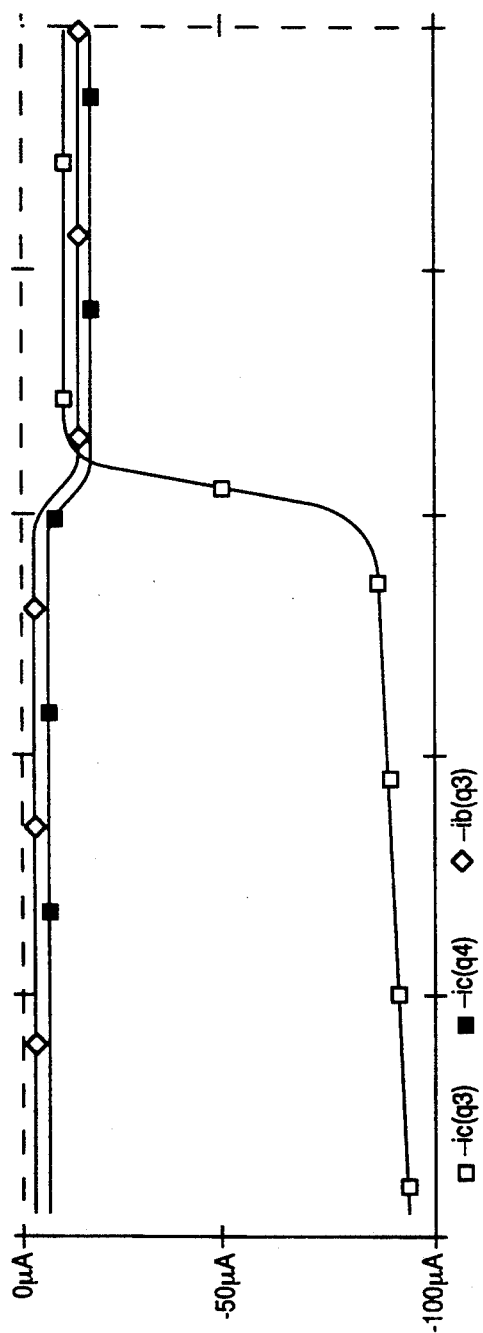
FIGS. 4(a) and 4(b) show current and voltage diagrams respectively for the comparator circuit FIG. 2 when current is flowing out of the input 24.
Figure 4B:
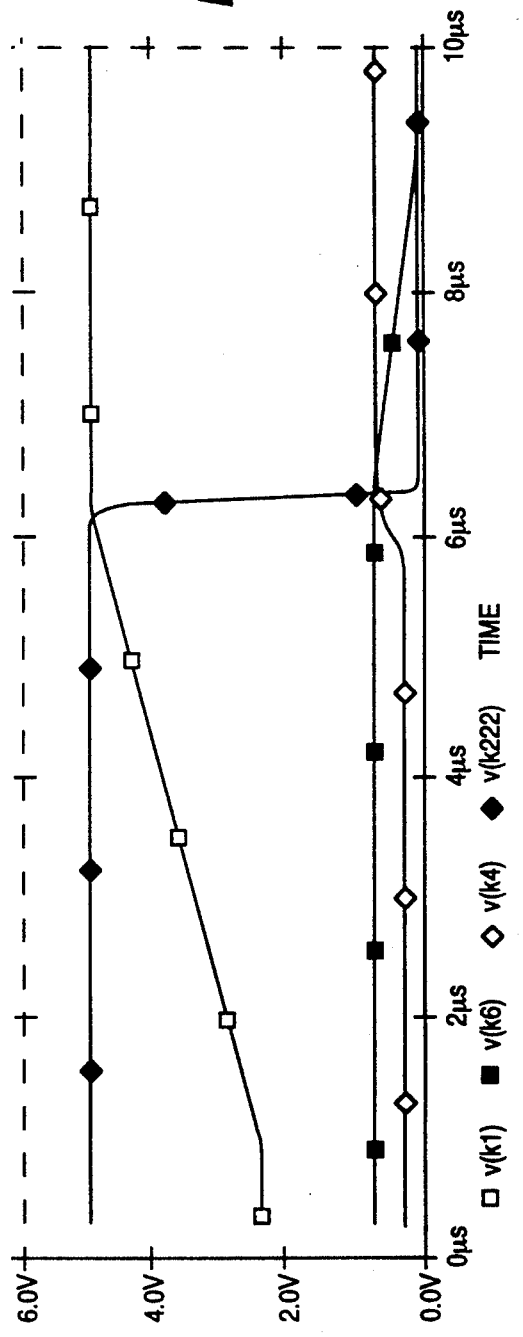

Some temporal current and voltage waveforms in the comparator circuit according to FIG. 2 for the case of a current flowing out of input 24 are shown in FIGS. 4(a) and 4(b), wherein:

ic(q3) is the collector current of transistor 251;
ic(q4) is the collector current of transistor 253;
ib(q3) is the base current of transistor 251;
v(k1) is the voltage at collector of transistor 242;
v(k6) is the voltage at base of transistor 242;
v(k4) is the voltage at base of transistor 22; and,
v(k222) is the voltage at collector of transistor 22 if this is coupled with the operating voltage 26 via a resistor.

If the operating voltage Vcc has a value of 5 volts for example, then the usable voltage range is [5 volts−(2*0.05 volts)]=4.9 volts. A ramp function with a period duration of 10 microseconds, for example, can be achieved using an integration capacitor 21 of an appropriate capacitance.

In a corresponding known circuit, for example, a voltage range of only 2.5 volts, defined by Vcc−2.5 volts, can be exploited. In order to implement a ramp function with the same duration of period, the integration capacitor 21 would have almost twice the capacitance value than in the invention and would, accordingly, require nearly twice the chip area.

What is claimed is:

1. A circuit, comprising:
a capacitance;
a first transistor operable with said capacitance for generating an integrated waveform responsive to an input signal;
a current mirror having a second transistor coupled to said capacitance and to said first transistor, both said transistors being unsaturated during charging and discharging of said capacitance and being triggered into saturation respectively responsive to having minimum and maximum values of said waveform;
means responsive to said transistors for generating output control signals.

2. The circuit of claim 1, wherein said output control signals change states responsive to said saturation of said transistors.

3. The circuit of claim 1, wherein said capacitance comprises an integrating capacitor, said transistors being collector coupled to said integrating capacitor and emitter coupled respectively to different poles of a voltage source.

4. The circuit of claim 7, wherein said means for generating said output control signals is coupled to said first transistor and to said current mirror.

5. The circuit of claim 1, wherein said waveform is developed at a node defined by a common junction of said capacitance and said transistors, said transistors being collector coupled to said node and emitter coupled respectively to different poles of a voltage source.

6. A circuit, comprising:
a capacitance;
a first transistor operable with said capacitance for generating an integrated waveform responsive to an input signal;
a second transistor coupled to said capacitance and to said first transistor, both said transistors being unsaturated during charging and discharging of said capacitance and being triggered into saturation respectively responsive to having minimum and maximum values of said waveform; and
means for generating complementary output signals responsive to detection of said saturation of said transistors.

7. The circuit of claim 6, wherein said means for generating complementary output signals responsive to detection of said saturation of said transistors comprises:
respective means for detecting said saturation of each of said transistors; and,
an output stage for generating complementary output signals responsive to said respective detecting means.

8. The circuit of claim 7, wherein each of said respective detecting means is coupled to one of said first and second transistors.

9. The circuit of claim 6, wherein said first and second transistors are collector coupled to said capacitance and emitter coupled respectively to different poles of a voltage source.

10. The circuit of claim 6, wherein said waveform is developed at a node defined by a common junction of said capacitance and said first and second transistors, said first and second transistors being collector coupled to said node and emitter coupled respectively to different poles of a voltage source.

11. A circuit, comprising:
a capacitance;

a first transistor operable with said capacitance for generating an integrated waveform responsive to an input signal;

a second transistor coupled to said capacitance, both said transistors being unsaturated during charging and discharging of said capacitance and being triggered into saturation responsive to peak values of said waveform, said transistors generating output control signals which change only when said transistors are triggered into said saturation; and, a voltage source coupled across said transistors, said waveform having a peak to peak voltage substantially coextensive with said voltage source.

12. The circuit of claim 11, further comprising means for detecting said output control signals.

13. The circuit of claim 12, further comprising an output stage for generating complementary output signals responsive to said detecting means.

14. The circuit of claim 11, wherein each of said transistors has a collector coupled to said capacitance and an emitter coupled to one pole of said voltage source.

15. The circuit of claim 14, wherein said peak to peak voltage of said signal is approximately:

$$V_{CC} - 2 \cdot V_{CE(sat)},$$

where $V_{CC}$ is the potential across said poles of said voltage source and $V_{CE\ (sat)}$ is the collector-emitter voltage of each of said transistors in saturation.

16. The circuit of claim 11, wherein said peak to peak voltage of said signal is approximately:

$$V_{CC} - 2 \cdot V_{CE(sat)},$$

where $V_{CC}$ is the potential of said voltage source and $V_{CE\ (sat)}$ is the collector-emitter voltage of each of said transistors in saturation.

17. The circuit of claim 11, wherein said waveform is developed at a node defined by a common junction of said capacitance and said transistors, said transistors being collector coupled to said node and emitter coupled to said voltage source.

18. A circuit, comprising:

an integrator, having a capacitance and having a first transistor operable with said capacitance, for generating a waveform responsive to an input signal; and, a comparator, having a second transistor coupled to said capacitance and to said first transistor, both said transistors being unsaturated during charging and discharging of said capacitance and being triggered into saturation respectively responsive to having minimum and maximum values of said waveform, and having means responsive to said triggering of said transistors into saturation for initiating comparator output control signals which change responsive to said triggering.

19. The circuit of claim 18, wherein said integrator operates responsive to a current control input signal.

* * * * *